(12) United States Patent
Chung et al.

(10) Patent No.: US 6,184,142 B1
(45) Date of Patent: Feb. 6, 2001

(54) PROCESS FOR LOW K ORGANIC DIELECTRIC FILM ETCH

(75) Inventors: Hsien-Ta Chung, Tai-Chung; Chan-Lon Yang, Taipei; Tong-Yu Chen, Hsin-Chu; Tri-Rung Yew, Chu-Tung Chen, all of (TW)

(73) Assignee: United Microelectronics Corp., Hsin-Chu (TW)

( * ) Notice: Under 35 U.S.C. 154(b), the term of this patent shall be extended for 0 days.

(21) Appl. No.: 09/302,204

(22) Filed: Apr. 26, 1999

(51) Int. Cl.$^7$ .................................................... H01L 21/00
(52) U.S. Cl. ............................. 438/692; 216/51; 216/75; 216/79; 438/723; 438/743; 438/738
(58) Field of Search .................................... 438/692, 710, 438/723, 725, 742, 743, 717, 720, 738, 745, 756; 216/47, 49, 51, 75, 79, 88

(56) References Cited

U.S. PATENT DOCUMENTS 6,030,901 * 2/2000 Hopper et al. .................... 438/725 X
6,037,266 * 3/2000 Tao et al. .......................... 438/738 X

* cited by examiner

Primary Examiner—William Powell
(74) Attorney, Agent, or Firm—Harness, Dickey & Pierce, P.L.C.

(57) ABSTRACT

A simplified method is disclosed for etching low k organic dielectric film. A substrate is provided with a hardmask layer and low k organic dielectric layer formed thereon in which hardmask layer is on the dielectric layer. A layer of photoresist is formed on the hardmask layer and imaged with a pattern by exposure through a dark field mask. As a key step, the pattern is transferred into the hardmask layer by dry etching and then the photoresist is stripped in-situ. Then, the interconnect is formed by using dry etching the low k organic dielectric layer using the hardmask layer as a mask, and readying it for the next semiconductor process.

18 Claims, 11 Drawing Sheets

1. Provide Low K organic Dielectric Film And A Hardmask Lager On Sudstrate.

2. Form Photoresist And Patterned.

3. Etching Hadrmask Layer And Ashing In-sitn.

4. Etching Low K Film.

PROCESS FOR LOW K ORGANIC DIELECTRIC FILM ETCH

BACKGROUND OF THE INVENTION

1. Field of the Invention

The present invention relates to the application of low k organic dielectric material used in fabrication of semiconductor devices, and more particularly to a method of etching such films.

2. Description of the Prior Art

As integrated circuit design rules have migrated into the deep submicron regime, both on-chip interconnects and associated fabrication processes have become critical to the performance, reliability, and manufacturing cost of integrated circuits. The needs for higher performance and lower cost for each new generation have led to dramatic reductions in wiring pitches, which have made signal propagation delay in the interconnects an appreciable and growing fraction of the total cycle time. In order to minimize the interconnect RC delay, low dielectric constant (low k, k<3) materials can be used as the interlevel dielectric (ILD) film, the majority of low k materials are based on spin-on organic polymers, such as FLARE, SILK, etc.

Because conventional etch blocking layer materials, such as photoresist materials, for example, are typically removed after etching and the characteristic of organic dielectric layer is similar to photoresist, these conventional spin-on organic low k materials will show limitations on process integration. The first is low resistance to $O_2$ plasma that requires complicated process sequence to protect these spin-on organic films. A method to solve this problem is that after having formed low k organic dielectric film, a hardmask layer is deposited on the dielectric film that can protect the organic dielectric film from ashing damaging. However, lateral etching can not stop happening. FIGS. 1A to 1C show the steps for detailed process flow of conventional method that damaging side wall of low k organic dielectric film.

After the photoresist 20 is imaged, dry etch 40 will transfer pattern into hardmask layer 14 and low k organic dielectric layer 12, as shown in FIG. 1A. Then, photoresist layer 20 is stripped by $O_2$ plasma and results lateral etching in organic dielectric layer 12 due to carbon content, as shown in FIG. 1B and FIG. 1C. Such result in dual damascene process will change etch profile, as shown in FIGS. 2A–2D. In this process, low k organic dielectric layers 12 and 13 are separated by a stop layer 16 which can stop trench etching in this layer. A cap layer 14 that can prevent moisture absorption is also like hardmask layer. After forming a photoresist layer 30, a hole pattern is transferred into photoresist layer 30 through imaging, as shown in FIG. 2A. Then, via is formed by using dry etching cap layer 14, low k organic dielectric layer 13, stop layer 16, and low k organic dielectric layer 12, as shown in FIG. 2B. Next, photoresist 30 is removed by using $O_2$ plasma and low k organic dielectric layers 12 and 13 are etched laterally, as shown in FIG. 2C. The following is trench etch and will cause the poor profile in FIG. 2D.

One way to solve this problem is choosing a type of low k organic silicon-oxide films with lower carbon-content in the film (between 5% to 20%) which showed better resistance to pure $O_2$ plasma during photoresist strip steps. But these low k organic silicon-oxide films still showed other limitations with conventional damascene etching: (1) $O_2$ plasma ashing changes k value, (2) $O_2$ plasma ashing changes etch profile undercut and bowing, (3) low selectivity to PR, and (4) need cap layer on the top of low k film to prevent moisture absorption which need to open before etching.

Due to high carbon content (>30%) in these spin-on organic low k films, another conventional method that requires multiple films as hardmask layer to avoid direct exposure of low k film to $O_2$ plasma is disclosed in FIGS. 3A–3G. First, a composite insulation layer comprising of low k organic dielectric film 12, $SiO_2$ film 17 and SiON ARC film 18 is deposited on a substrate 10. Photoresist 30 is formed on the SiON layer 18 and imaged. SiON layer 18 is etched by using dry etch 40, as shown in FIG. 3A. Then photoresist 30 is stripped while low k film 12 can prevent from $O_2$ plasma damage due to $SiO_2$ layer 17; then $SiO_2$ layer 17 is etched using SiON layer 16 as etch hardmask, as shown in FIG. 3B. Next, low k organic dielectric film 13, $SiO_2$ layer 15, and SiON layer 14 is deposited in sequence and then another photoresist layer 31 is deposited with imaged, as shown in FIG. 3C. As the same steps from FIG. 3A to 3B, SiON layer 14 is etched using photoresist layer 31 as a mask, as shown in FIG. 3D. Then, photoresist layer 31 is stripped with avoiding $O_2$ plasma damage on low k film 13 for the same reason mentioned above; then, $SiO_2$ layer 15 is etched using SiON layer 14 as etch hardmask, as shown in FIG. 3E. Then, dual damascene structure is formed by using anisotropically etching low k organic dielectric films 13 and 12, as shown in FIG. 3F. Cross section of dual damascene structure is formed after metal barrier layer and metal layer deposition in sequence and etching excess metal by using chemical mechanical polishing method. However, this method has intricate steps in dual damascene technology.

SUMMARY OF THE INVENTION

In accordance with the present invention, a method is provided for etching low k organic dielectric film in a semiconductor device that substantially avoids the complicated process flow from spin-on low k organic dielectric layer.

It is another object of this invention to overcome the integration issues from conventional damascene etching for organic silicon-oxide films.

It is still another object of this invention to take the advantages of cap layer on top of low k film preventing moisture absorption.

It is yet another object of this invention that in-situ process step to simplify the process flow and lower production cost.

In one embodiment, a substrate having a low k dielectric layer on and a cap layer formed thereon is provided. A photoresist layer is formed on the cap layer, and patterned by exposing using a dark field photo mask. As a key step, the cap layer is etched using photoresist layer as a mask thereby transferring the pattern in photoresist layer into cap layer, and in-situ photoresist layer is removed in the same etcher. Then, low k organic dielectric layer is etched using cap layer as a mask thereby transferring the pattern on cap layer into low k organic dielectric layer. The excess step is depositing a metal layer and etching back excess metal layer by using chemical mechanical polishing method to form via.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
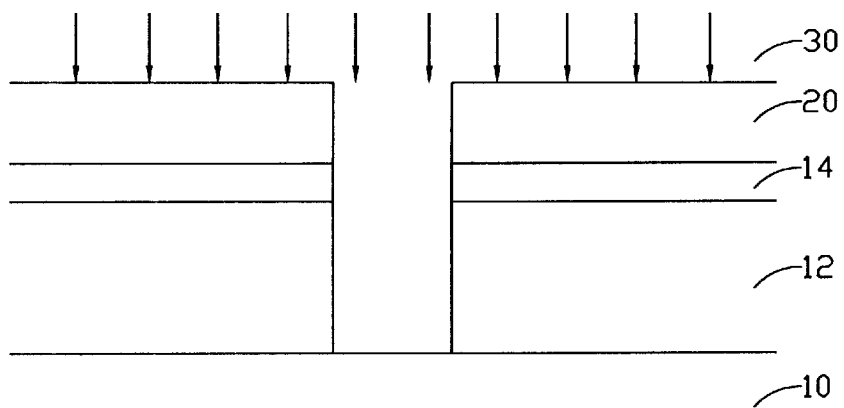
FIGS. 1A to 1C are schematic representations of structures at various stages during the formation of via using conventional, prior art technology.
Figure 1B:
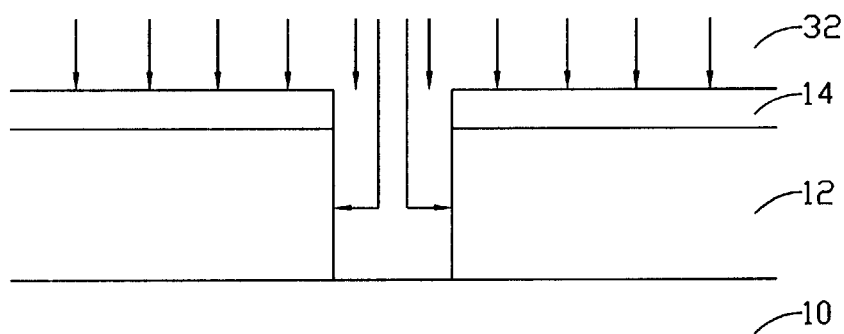
Figure 1C:
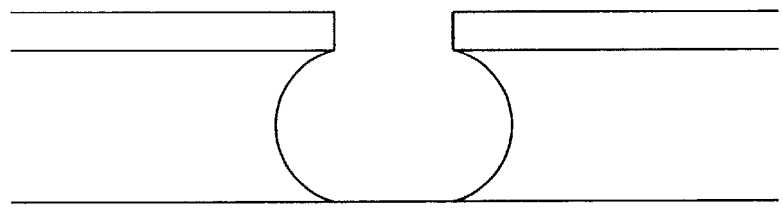
Figure 2A:
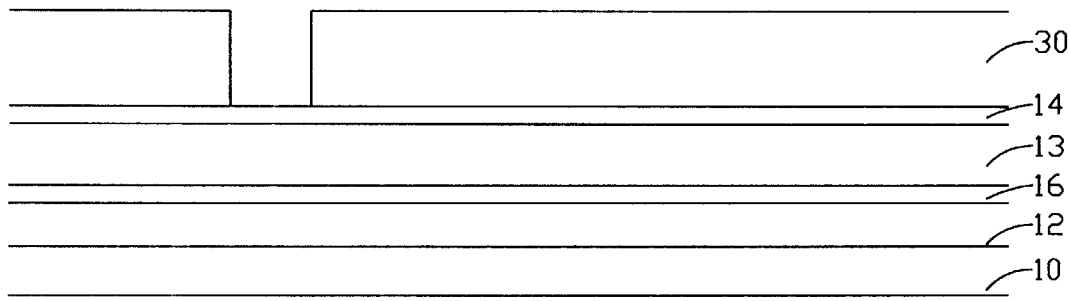
FIGS. 2A to 2D are schematic representations of structures at various stages during the formation of dual damascene pattern using one conventional, prior art technology.
Figure 2B:
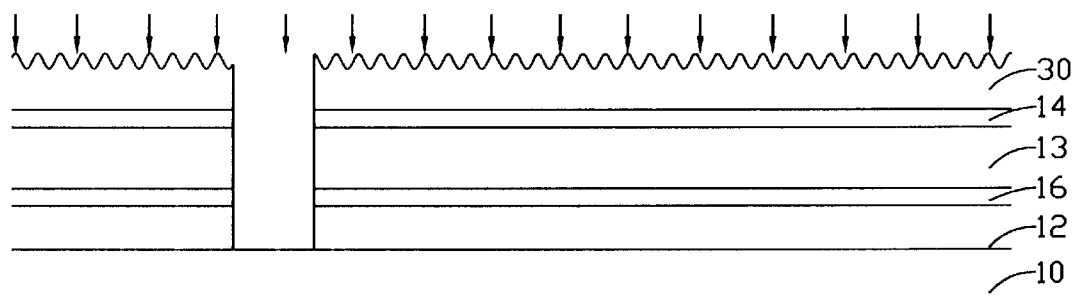
Figure 2C:
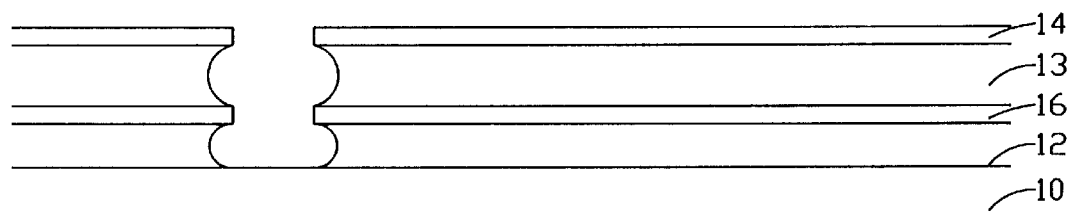
Figure 2D:
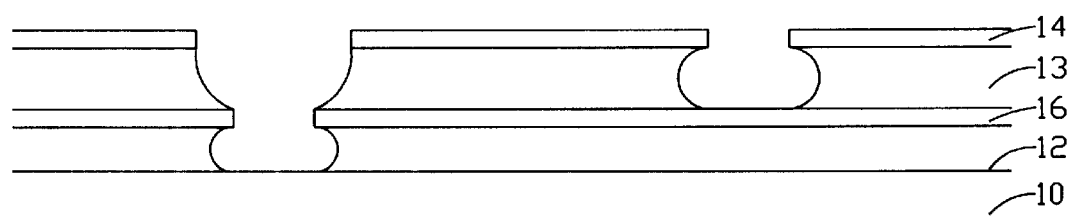
Figure 3A:
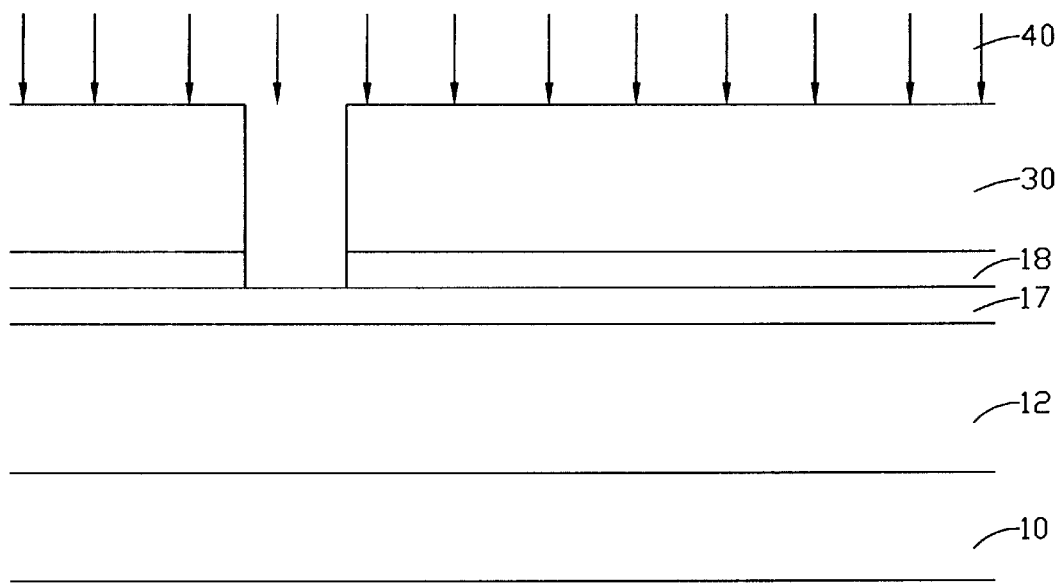
FIGS. 3A to 3G are schematic representations of structures at various stages during the formation of dual damascene pattern using another conventional, prior art technology.
Figure 3B:
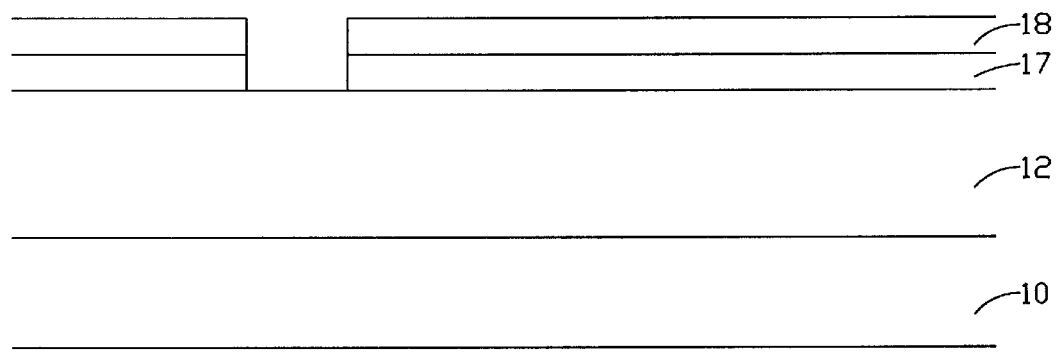
Figure 3C:
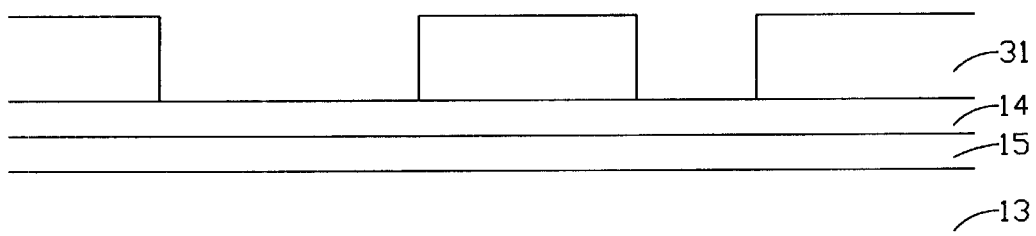
Figure 3C:
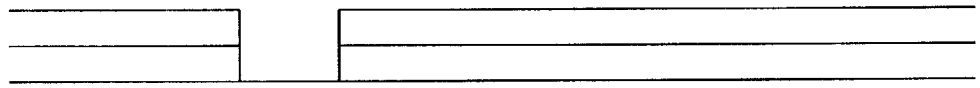
Figure 3C:
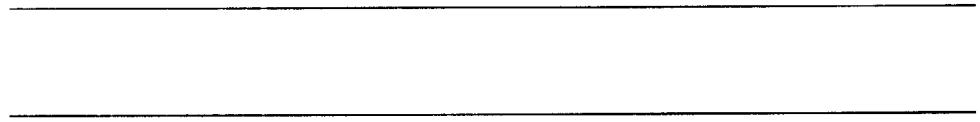
Figure 3D:
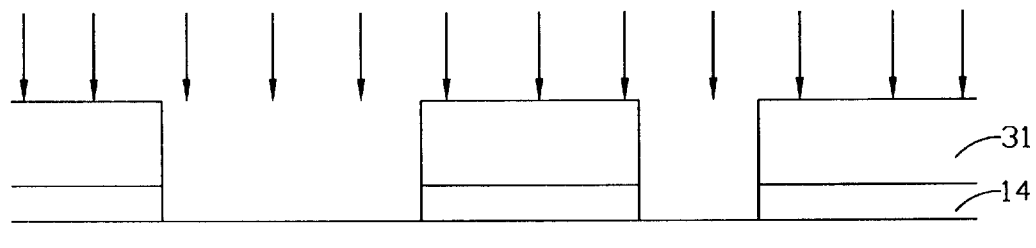
Figure 3D:
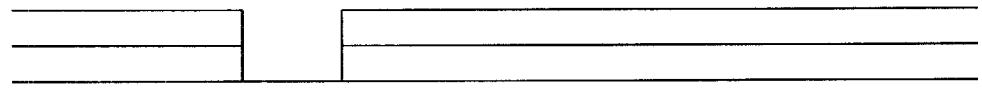
Figure 3D:
Figure 3E:
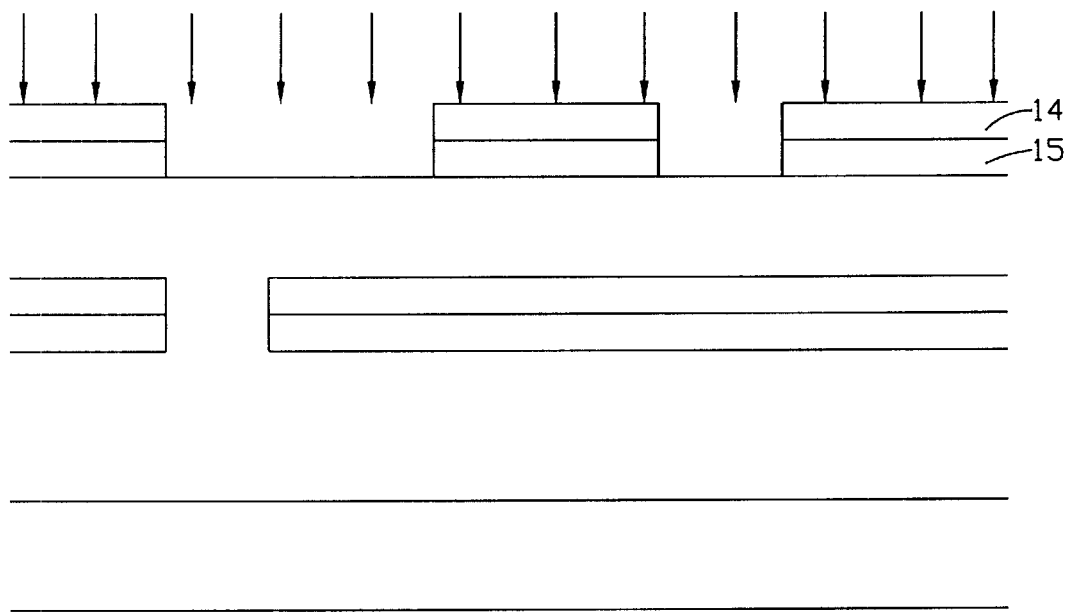
Figure 3F:
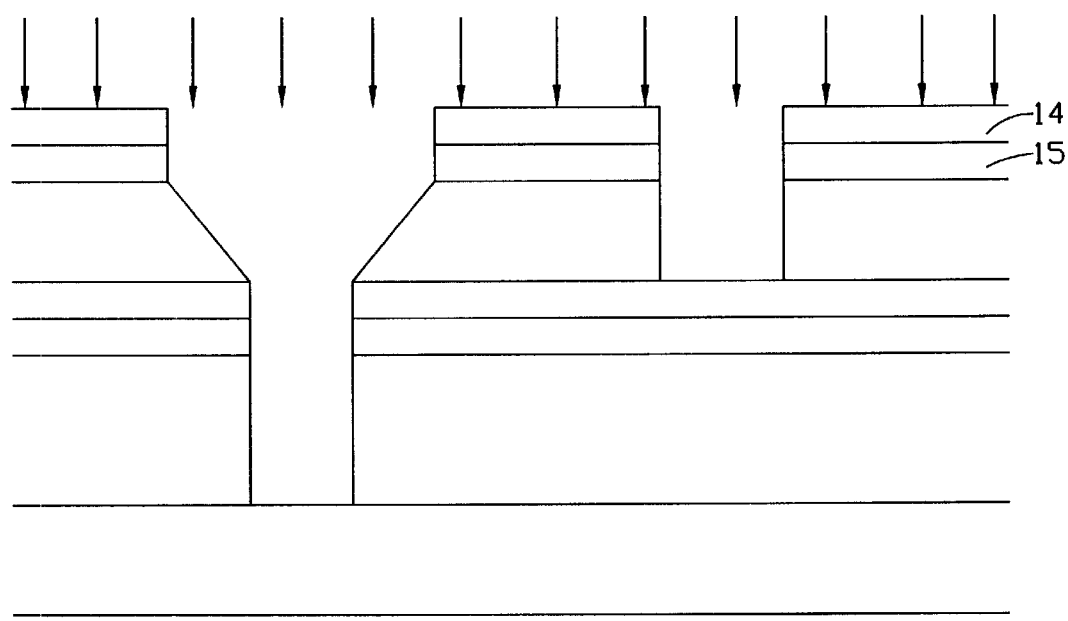
Figure 3G:
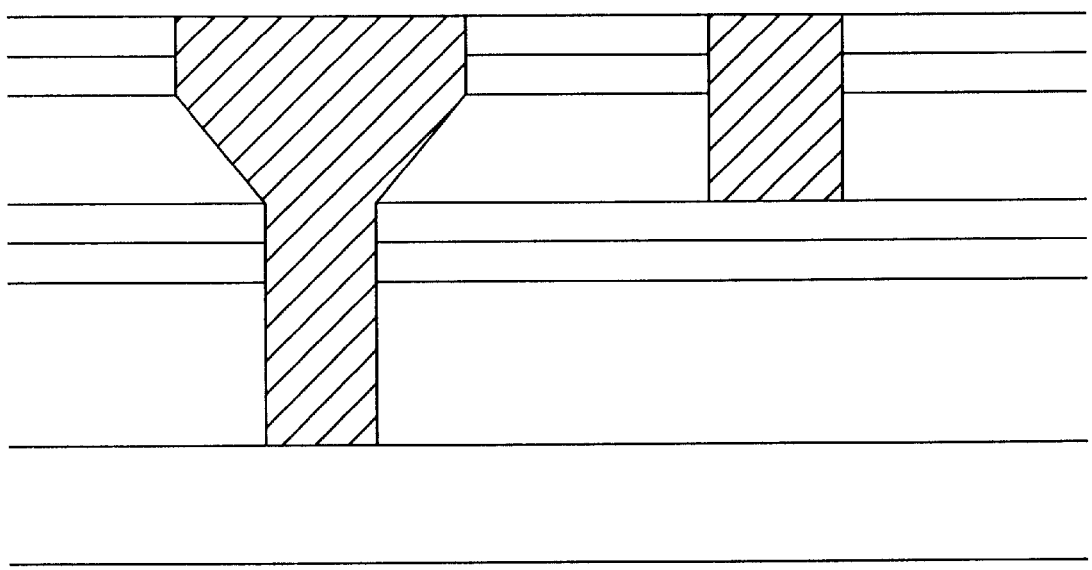
Figure 4:
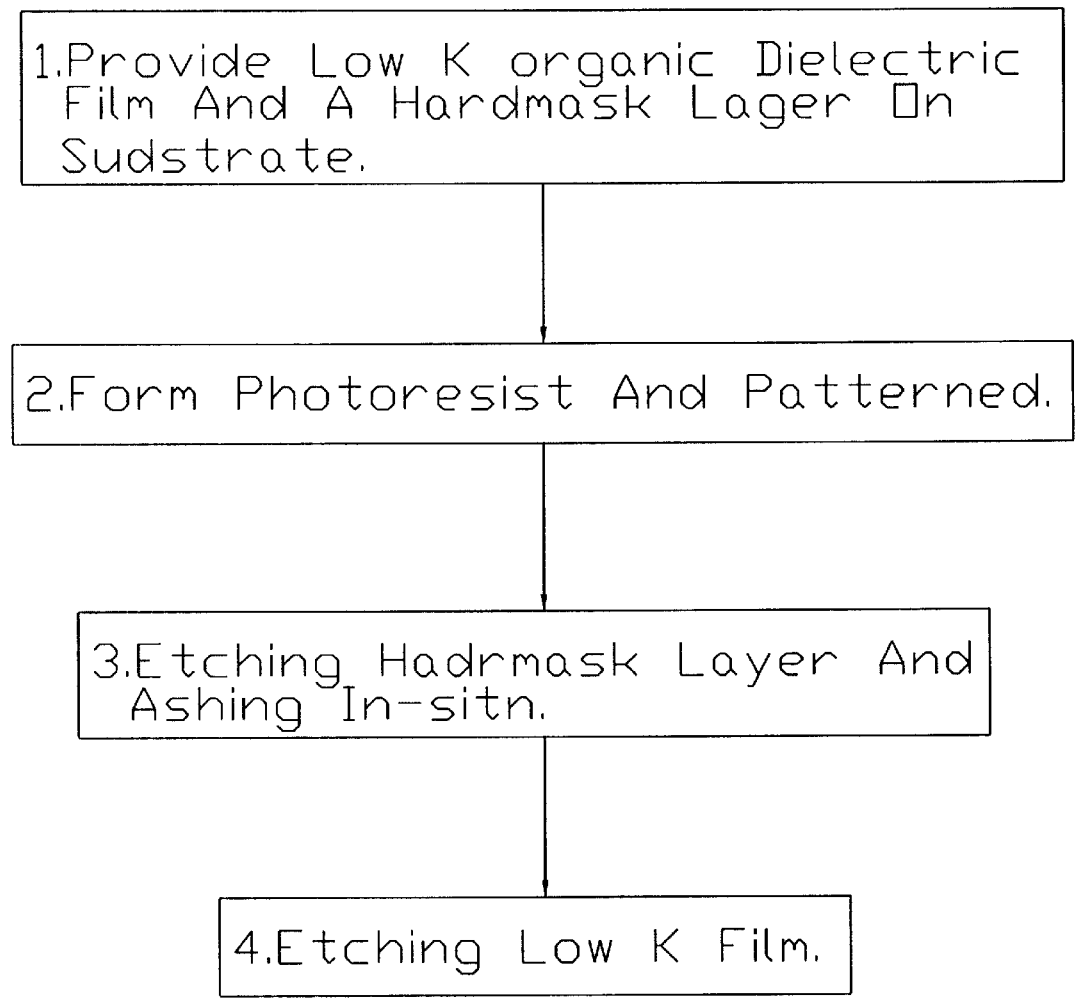
FIG. 4 is a flow diagram showing the steps for etching a low k organic dielectric film in according with a method disclosed herein.

In this embodiment, a hardmask etch and in-situ photoresist ashing approach is disclosed following. Referring to FIG. 4 shows a flow diagram summarizing the steps in one method of etching low k organic dielectric films in accordance with this disclosure. First, a substrate is provided with a low k organic dielectric layer and a hardmask layer formed thereon. Then, photoresist layer is formed on the hardmask layer and patterned by exposure. Next, hardmask is etched using photoresist as a mask and in-situ photoresist ashing. Then, etch low k organic dielectric layer using hardmask as a mask to transfer pattern into low k organic dielectric layer. Suitable conditions for performing the various steps set forth in FIG. 4 are set forth below and will be explained by reference to FIGS. 5A to 5C.

Figure 5A:
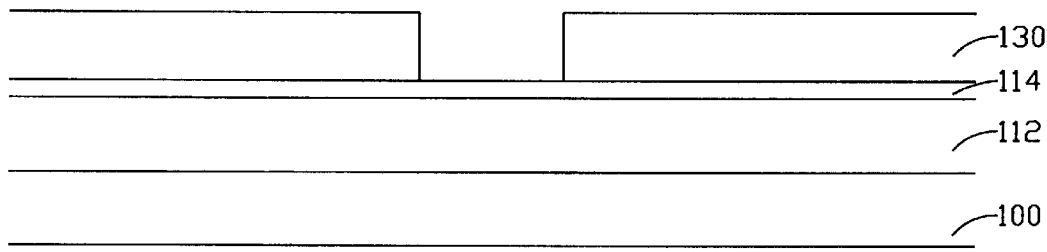
FIGS. 5A to 5D are schematic representations of structures at various stages during the formation of via in according with the method of this disclosure.

Referring to FIG. 5A, substrate 100 is provided with a composite dielectric insulation comprising bottom and top layers 112 and 114, respectively. A first layer of photoresist 130 is next formed on the composite layer.

The bottom layer 112 is coated spin-on low k organic dielectric film by using any suitable conventional method. In this embodiment, the material of this low k organic dielectric film 112 can be selected from FLARE, SILK, etc., and the thickness of this layer 112 is ranged about from 6000 to 10000 angstroms.

The top layer 114 is a hardmask layer such as silicon oxide ($SiO_2$) or silicon oxynitride (SiON) and also can be used as cap layer to prevent from moisture absorption. It is preferred that top layer 114 is deposited using any conventional method such as plasma enhanced chemical vapor deposition and that it has a thickness between about 500 to 1000 angstroms. It will briefly be noted here that substrate in FIG. 5A is provided with a substructure of devices formed in the substrate and/or metal layers thereof, and as they are not significant to the invention, they are not described in detail in order not to unnecessarily obscure the present invention.

The preferred thickness of photoresist layer 130 shown in FIG. 5A is between about 0.6 to 0.8 micrometers. A dark field mask is used to expose photoresist layer 130 to form pattern such as via or contact.

Figure 5B:
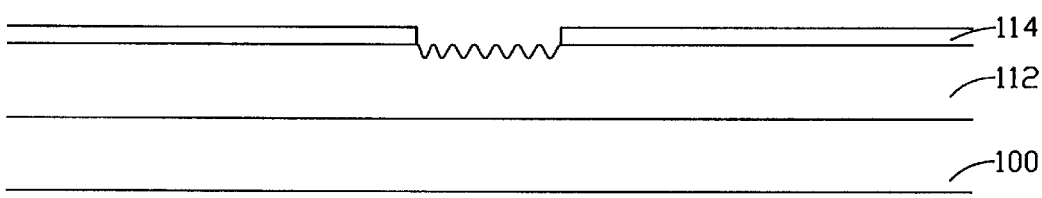

In according with the main feature of this invention, pattern in the photoresist layer 130 is transferred into top layer 114 as shown in FIG. 5B by using any conventional method such as dry etch. Then, photoresist layer 130 is removed in-situ by using $O_2$ plasma treatment in the same etcher. This plasma treatment will lightly etch the surface of low k organic dielectric layer 112 in FIG. 5B, however, this damaged potion will be removed in the following etching step.

Figure 5C:
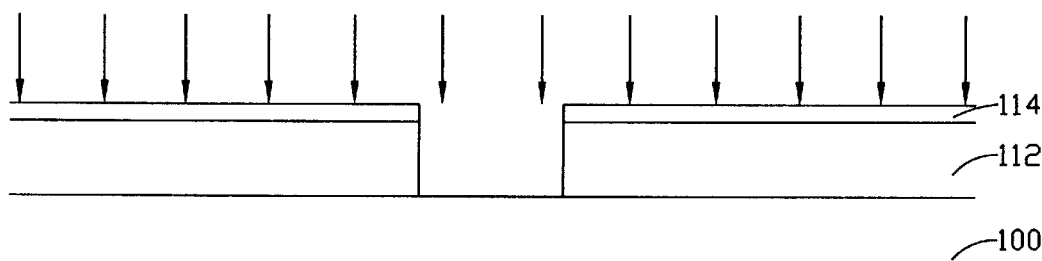
Figure 5D:
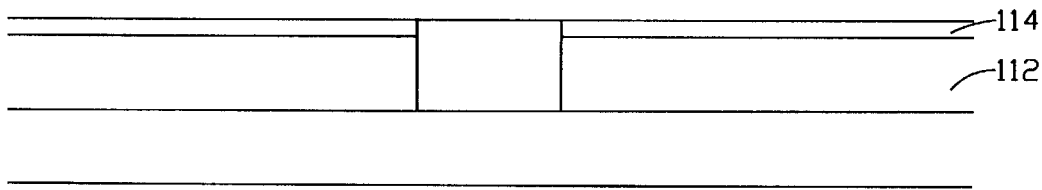

Referring to FIG. 5C, the pattern of top layer 114 is transferred into low k organic dielectric layer 1 12 by using any suitable conventional anisotropically etch method. Moreover, a barrier layer (not shown in figures) is used to protect metal formed in substrate 100 from etching damage. Up to the present, FIGS. 5A to 5C illustrate the steps in FIG. 4. Then, a damascene structure is finished by deposition a metal layer plus etching back excess metal by chemical mechanical polishing, as shown in FIG. 5D.

The invention mentioned above can be applied to dual damascene technology for a simplified method in multilevel fabrication process, and dual damascene process will be introduced briefly next. Referring to the FIG. 6A, a low k organic dielectric layer 112, a stop layer 116, another low k organic dielectric layer 113, and a cap layer 114 is deposited on substrate 100 in sequence. A first layer of photoresist 130 is next formed on the cap layer 114. Similarly, the substrate 100 is provided with a substructure devices formed in the substrate as the above embodiment.

The stop layer 114 is an etch barrier film such as silicon nitride (SiN) to prevent the upper trench patterns of dual damascene from being etched through if the low k organic dielectric layer 112 underlying the stop layer 116 is for via or contact. Other barrier layer may be used such as silicon oxynitride (SiON) as long as it has different etch characteristics than low k organic dielectric film and can be used as ARC layer. That is, stop layer 114 allows a selective etch process with respect to different underlying materials and also eliminates reflection of incident light. The material and characteristics of cap layer 114 is the same in FIG. 5A.

Figure 6A:
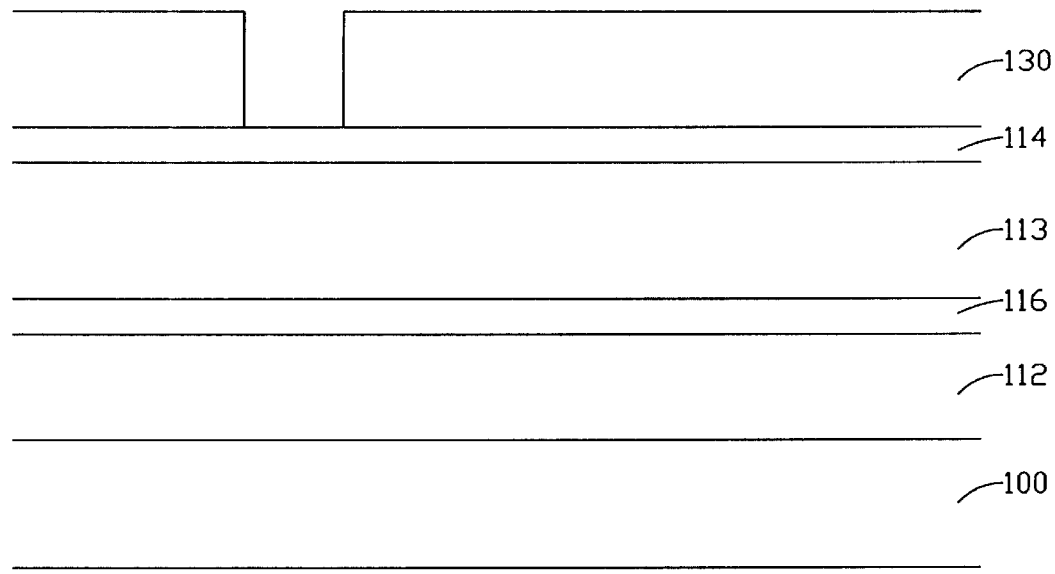
FIGS. 6A to 6F are schematic representations of structures at various stages during the formation of dual damascene pattern in according with the method of this disclosure.

Two low k organic dielectric layers 112 and 113, stop layer 116, and cap layer 114 are formed using any suitable method and all their thickness will take appropriate values. Photoresist layer 130 is formed using any conventional method and the thickness of photoresist layer 130 is about from 0.6 to 0.8 micrometers. Then, a hole pattern is transferred into photoresist layer 130 through exposure, as shown in FIG. 6A.

Figure 6B:
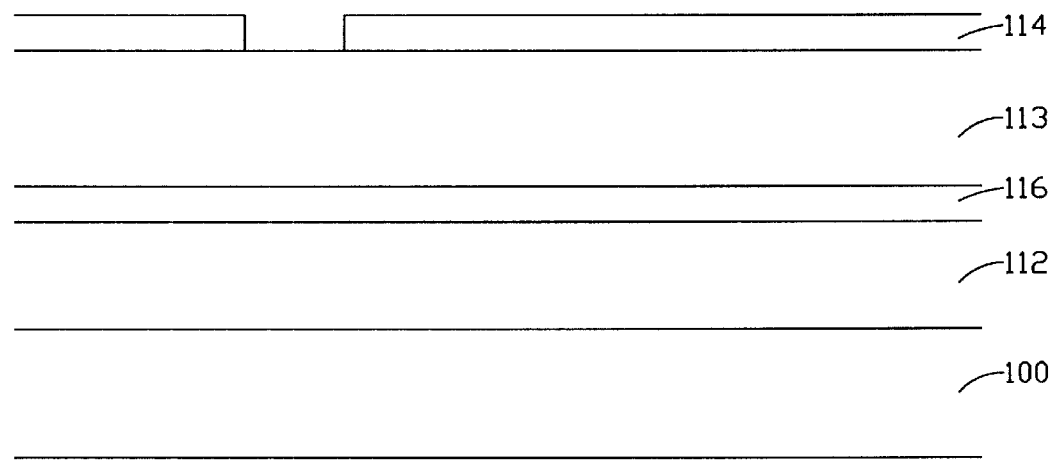

The same key point in above embodiment, the hole pattern of photoresist layer 130 is transferred into cap layer 114 by using conventional dry etch method and in-situ the photoresist layer 130 is removed by using $O_2$ plasma treatment in the same etcher, as shown in FIG. 6B.

Figure 6C:
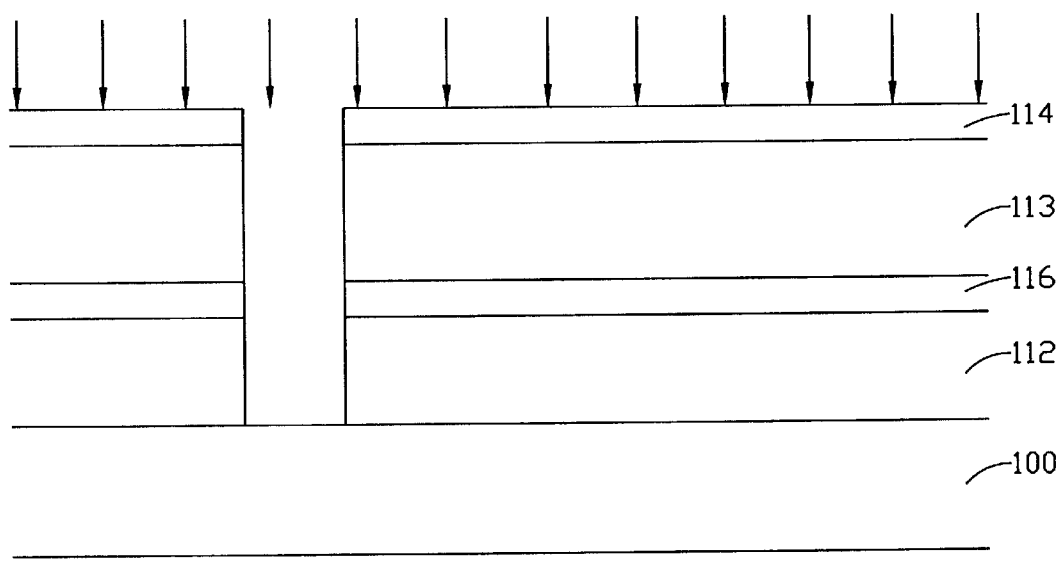

Then, the hole pattern of cap layer 114 is transferred into two low k organic layers 112 and 113 including stop layer 116 by using any suitable conventional anisotropic dry etch method, as shown in FIG. 6C. A barrier layer (not shown in figures) formed between substrate 100 and low k film 112 will prevent from etching damage.

Figure 6D:
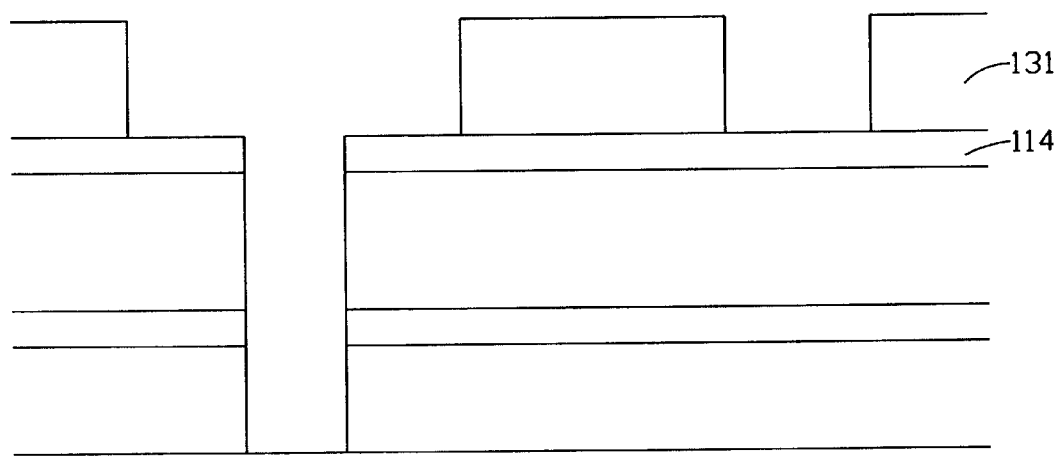
Figure 6E:
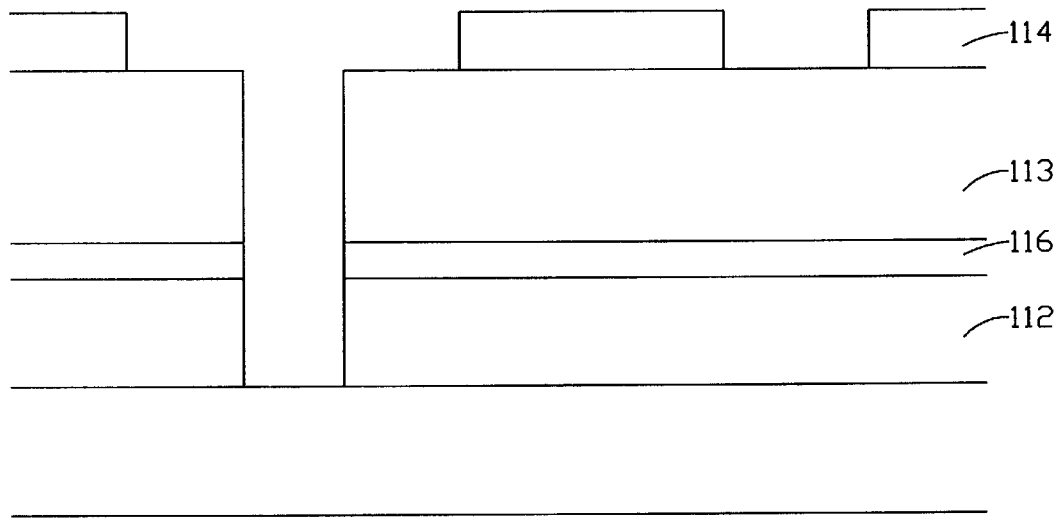
Figure 6F:
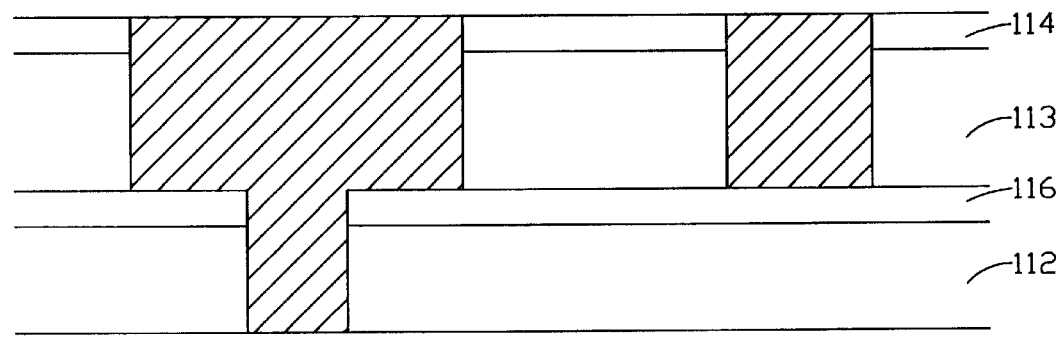

Having formed hole pattern in dual damascene, trench is formed next. Another photoresist layer 131 is formed and imaged line patterns with prior conditions depicted in FIG. 6A, as shown in FIG. 6D. Then, line patterns of photoresist layer 131 is transferred into cap layer 114 by using conventional dry etch method and in-situ the photoresist layer 131 is removed by $O_2$ plasma treatment in the same etcher, as shown in FIG. 6E. Next, line patterns of cap layer 114 is transferred into low k organic dielectric layer 113 by using prior conditions depicted in FIG. 5C to form trench. The residual steps is deposition barrier metal layer and metal layer in sequence and removing excess metal by chemical mechanical polishing method, as shown in FIG. 6F.

Although specific embodiments have been illustrated and described, it will be obvious to those skilled in the art that various modifications may be made without departing from what is intended to be limited solely by the appended claims.

What is claimed is:

1. A method for etching low k organic dielectric film, said process comprising:

providing a substrate having a low k organic dielectric layer on said substrate and a hardmask layer on said low k organic dielectric layer;

forming a photoresist layer on said hardmask layer;

patterning said photoresist layer by exposing said photoresist layer using a dark field photo mask;

etching said hardmask layer using said photoresist layer as a mask thereby transferring said pattern in said photoresist layer into said low k organic dielectric layer;

in-situ removing said photoresist layer; and etching said low k organic dielectric layer using said hardmask layer as a mask thereby transferring said pattern on said hardmask layer into said low k organic dielectric layer.

2. The method according to claim 1, wherein said low k organic dielectric layer comprises an aromatic hydrocarbon material.

3. The method according to claim 1, wherein said hardmask layer is silicon oxide layer.

4. The method according to claim 1, wherein said photoresist layer is removed by $O_2$ plasma treatment.

5. The method according to claim 1, further comprising a barrier layer between said substrate and said low k organic dielectric layer.

6. The method according to claim 1, wherein the step of in-situ etching said hardmask and removing said photoresist is in the same etcher.

7. A method for forming damascene pattern employing low k organic dielectric films as insulation layer, said method comprising:

providing a substrate having a low k organic dielectric layer on said substrate and a cap layer on said low k organic dielectric layer;

forming a photoresist layer on said cap layer;

patterning said photoresist layer by exposing said photoresist layer using a dark field photo mask;

etching said cap layer using said photoresist layer as a mask thereby transferring said pattern in said photoresist layer into said cap layer;

in-situ removing said photoresist layer;

etching said low k organic dielectric layer using said cap layer as a mask thereby transferring said pattern on said cap layer into said low k organic dielectric layer;

depositing a metal layer; and etching back excess said metal layer by using chemical mechanical polishing method.

8. The method according to claim 7, wherein said low k organic dielectric layer comprises an aromatic hydrocarbon material.

9. The method according to claim 7, wherein said cap layer is silicon oxide layer.

10. The method according to claim 7, wherein said photoresist layer is removed by $O_2$ plasma treatment.

11. The method according to claim 7, further comprising a barrier layer between said substrate and said low k organic dielectric layer.

12. The method according to claim 7, wherein the step of in-situ etching said hardmask and removing said photoresist is in the same etcher.

13. A method for forming dual damascene pattern employing low k organic dielectric films as insulation layer, said method comprising:

providing a substrate having a first low k organic dielectric layer on said substrate, a stop layer on said first low k organic dielectric layer, a second low k organic dielectric layer, and a cap layer on said second low k organic dielectric layer;

forming a first photoresist layer on said cap layer;

hole patterning said first photoresist layer by exposing said first photoresist layer using a dark field photo mask;

etching said cap layer using said first photoresist layer as a mask thereby transferring said hole pattern in said first photoresist layer into said cap layer;

in-situ removing said first photoresist layer;

etching said second low k organic dielectric layer, said stop layer, and said first low k organic dielectric layer using said cap layer as a mask thereby transferring said hole pattern on said cap layer into said first and second low k organic dielectric layer;

forming a second photoresist layer on said cap layer;

line patterning said second photoresist layer by exposing said second photoresist layer using a dark field photo mask;

etching said cap layer using said second photoresist layer as a mask thereby transferring said line pattern in said second photoresist layer into said cap layer;

in-situ removing said second photoresist layer;

etching said second low k organic dielectric layer using said cap layer as a mask thereby transferring said line pattern on said cap layer into said second low k organic dielectric layer;

depositing a metal layer; and etching back excess said metal layer by using chemical mechanical polishing method.

14. The method according to claim 13, wherein said low k organic dielectric layer comprises an aromatic hydrocarbon material.

15. The method according to claim 13, wherein said hardmask layer is silicon oxide layer.

16. The method according to claim 13, wherein said photoresist layer is removed by $O_2$ plasma treatment.

17. The method according to claim 13, further comprising a barrier layer between said substrate and said low k organic dielectric layer.

18. The method according to claim 13, wherein the step of in-situ etching said hardmask and removing said photoresist is in the same etcher.

* * * * *